United States Patent
La Rosa et al.

(10) Patent No.: US 9,941,369 B2
(45) Date of Patent: *Apr. 10, 2018

(54) MEMORY CELL COMPRISING NON-SELF-ALIGNED HORIZONTAL AND VERTICAL CONTROL GATES

(71) Applicant: STMicroelectronics (Rousset) SAS, Rousset (FR)

(72) Inventors: Francesco La Rosa, Rousset (FR); Stephan Niel, Meylan (FR); Julien Delalleau, Marseilles (FR); Arnaud Regnier, Les Talliades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,784

(22) Filed: Jun. 28, 2016

(65) Prior Publication Data

US 2016/0308011 A1  Oct. 20, 2016

Related U.S. Application Data

(63) Continuation of application No. 14/528,785, filed on Oct. 30, 2014, now Pat. No. 9,406,686.

(30) Foreign Application Priority Data

Oct. 31, 2013  (FR) ...................... 13 60742

(51) Int. Cl.
*H01L 29/788* (2006.01)
*H01L 29/423* (2006.01)
(Continued)

(52) U.S. Cl.
CPC .... *H01L 29/42328* (2013.01); *G11C 16/0425* (2013.01); *G11C 16/14* (2013.01);
(Continued)

(58) Field of Classification Search
CPC ............... H01L 29/788; H01L 29/7883; H01L 29/7885; H01L 27/11524; G11C 16/0425
See application file for complete search history.

(56) References Cited

U.S. PATENT DOCUMENTS 5,495,441 A  2/1996  Hong
5,675,161 A  10/1997  Thomas
(Continued)

FOREIGN PATENT DOCUMENTS

CN  101005077 A  7/2007
FR  2987697 A1  9/2013

OTHER PUBLICATIONS

English translation of CN101005077 Jul. 25, 2007.*

*Primary Examiner* — Allison P Bernstein
(74) *Attorney, Agent, or Firm* — Seed Intellectual Property Law Group LLP

(57) ABSTRACT

The present disclosure relates to a memory cell comprising a vertical selection gate extending in a trench made in a substrate, a floating gate extending above the substrate, and a horizontal control gate extending above the floating gate, wherein the floating gate also extends above a portion of the vertical selection gate over a non-zero overlap distance. Application mainly to the production of a split gate memory cell programmable by hot-electron injection.

18 Claims, 11 Drawing Sheets

(51) Int. Cl.
  *H01L 21/28*      (2006.01)
  *H01L 29/66*      (2006.01)
  *H01L 27/11521*   (2017.01)
  *G11C 16/14*      (2006.01)
  *H01L 21/3205*    (2006.01)
  *H01L 21/3213*    (2006.01)
  *H01L 27/11524*   (2017.01)
  *H01L 29/78*      (2006.01)
  *G11C 16/04*      (2006.01)
  *H01L 21/306*     (2006.01)

(52) U.S. Cl.
  CPC .. *H01L 21/28273* (2013.01); *H01L 21/30604* (2013.01); *H01L 21/32051* (2013.01); *H01L 21/32133* (2013.01); *H01L 27/11521* (2013.01); *H01L 27/11524* (2013.01); *H01L 29/42336* (2013.01); *H01L 29/66666* (2013.01); *H01L 29/66825* (2013.01); *H01L 29/788* (2013.01); *H01L 29/7827* (2013.01); *H01L 29/7881* (2013.01); *H01L 29/7883* (2013.01); *H01L 29/7885* (2013.01)

(56) References Cited

U.S. PATENT DOCUMENTS

| | | |
|---|---|---|
| 5,745,410 A     | 4/1998  | Yiu et al. |
| 6,496,417 B1    | 12/2002 | Shiau et al. |
| 6,696,724 B2    | 2/2004  | Verhaar |
| 7,037,787 B2    | 5/2006  | Fan et al. |
| 7,253,057 B1    | 8/2007  | Lojek |
| 7,982,255 B2    | 7/2011  | Abbott |
| 8,901,634 B2    | 12/2014 | La Rosa et al. |
| 2001/0021117 A1 | 9/2001  | Cavaleri et al. |
| 2002/0175394 A1 | 11/2002 | Wu et al. |
| 2004/0109354 A1 | 6/2004  | Wang et al. |
| 2005/0052918 A1 | 3/2005  | Dormans et al. |
| 2006/0158930 A1 | 7/2006  | Thomas |
| 2006/0280000 A1 | 12/2006 | Thomas |
| 2008/0070363 A1* | 3/2008 | Mokhlesi ............ H01L 27/115 438/266 |
| 2009/0242959 A1 | 10/2009 | Lin et al. |
| 2010/0133602 A1 | 6/2010  | Do et al. |
| 2013/0250700 A1 | 9/2013  | La Rosa |
| 2015/0236031 A1* | 8/2015 | Mantelli ........... H01L 27/11524 365/185.28 |

* cited by examiner

MEMORY CELL COMPRISING NON-SELF-ALIGNED HORIZONTAL AND VERTICAL CONTROL GATES

BACKGROUND

Technical Field

The present disclosure relates to split gate memory cells each comprising a selection transistor section and a floating-gate transistor section. The selection transistor section comprises a selection gate and the floating-gate transistor section comprises a floating gate and a control gate.

Description of the Related Art

So-called "split gate" memory cells are conventionally programmed by hot-electron injection (or "hot-carrier injection"). Compared to tunnel-effect programming, programming by hot electrons has the advantage of being short, generally 100 times shorter than tunnel-effect programming. The programming time of a memory cell by hot-electron injection is typically in the order of a few microseconds compared to a few milliseconds for tunnel-effect programming.

During hot-electron programming, the two transistor sections of the memory cell cooperate in order to inject electric charges into the floating gate. The selection transistor section has a conductive channel in which a current appears, which comprises high kinetic energy electrons, referred to as "hot electrons". When this current reaches the conductive channel of the floating-gate transistor section, an injection zone appears where the high energy electrons are injected into the floating gate under the effect of a transverse electric field created by the voltage applied to the control gate.

FIG. 1 shows the arrangement of a conventional split gate memory cell $C1_{i,j}$ in a word line $WL_i$ of a memory array. The selection gate SG of the selection transistor ST section of the memory cell is connected to a selection line $SL_i$ and the control gate CG of the floating-gate transistor FGT section is connected to a control gate line $CGL_i$. The drain D of the selection transistor section is connected to a bit line $BL_j$ and the source S of the floating-gate transistor FGT section is connected to a source line $SCL_i$. The selection $SL_i$, control gate $CGL_i$, and source $SCL_i$ lines are parallel and linked to all the memory cells of the word line. The bit line $BL_j$ is transverse to the lines $SL_i$, $CGL_i$, $SCL_i$ and is also connected to memory cells belonging to other word lines (not represented).

The selection line $SL_i$ receives a selection voltage $VS_i$ the control gate line $CGL_i$ receives a gate voltage $VG_i$ and the source line $SCL_i$ receives a source voltage VSC. The voltage VG is generally high, for example 10V, to generate in the channel of the floating-gate transistor FGT section a transverse electric field favoring the injection of electrons into the floating gate. Voltage VSC is sufficiently high, for example 4V, to ensure the conduction of the memory cell. Voltage VS is generally set at a value greater than the threshold voltage of the selection transistor section, for example between 1V and 3V. A programming current passes through the memory cell and the bit line $BL_j$. A flow of electrons circulating in the opposite direction to the current passes through the channel of the selection transistor section until it reaches the injection point into the channel of the floating-gate transistor section.

Offsetting their good injection performance, split gate memory cells have the disadvantage of occupying more semiconductor surface than conventional flash memory cells, also programmed by hot-electron injection but comprising only one control gate.

U.S. Pat. No. 5,495,441 discloses a so-called "split gate" memory cell the selection transistor section of which is arranged vertically to reduce the footprint of the memory cell. FIG. 2 corresponds to FIG. 7 of that document and shows a cross-section of the structure of such a memory cell. The numerical references in FIG. 2 are those of the original FIG. 7 of the aforementioned document. The memory cell C2 shown in FIG. 2 comprises a trench etched in a substrate (27) after forming a floating gate FG (28) made of polysilicon (polycrystalline silicon) above the substrate. The trench has then been covered with an oxide layer (200a, 200b). A conductive layer made of polysilicon (26) has then been deposited on the entire memory cell. The conductive layer (26) has a portion extending in the trench and forming a vertical selection gate SG, a portion extending over the floating gate FG (28) forming a horizontal control gate CG, the rest of the conductive layer forming a selection line SL of the memory cell. A doped region (21) implanted in the substrate forms a bit line BL and doped regions (20) implanted at the bottom of the trench form "source bit lines" SBL that are parallel to the bit line BL (21). The memory cell C2 thus comprises a selection transistor ST section having a vertical channel of length L1, and a floating-gate transistor FGT section having a horizontal channel of length L2, which cooperate to form a transistor having a channel of length L1+L2. The control CG and selection SG gates of the two transistor FGT, ST sections are formed by the same conductive layer (26) and therefore form a single component. The memory cell C2 is formed together with a memory cell C2' linked to the same selection line SL (26) and to the same bit line BL (21), but to a different "source bit line" SBL' (20).

As shown in FIG. 3, this structure of memory cell C2, C2' has a memory array architecture that differs greatly from the conventional architecture shown in FIG. 1. The sources S of the selection transistor ST sections of the two twin memory cells are connected to the "source bit lines" SBL (20), SBL' (20) that are parallel to the bit line BL (21). The selection line SL (26), and the gates SG (26) and CG (26) of the memory cells are at the same electric potential, the gates SG and CG thus forming a single selection/control gate.

This memory cell structure offers a low footprint thanks to the vertical arrangement of the selection transistor section. On the other hand, it involves a multiplication of the number of source lines, in the form of "source bit lines" SBL, thus entailing a multiplication of the means for switching voltages in the memory array. For example, a word line comprising 1,024 memory cells will have 512 bit lines and 1,024 "source bit lines" parallel to the bit lines, compared to 1,024 bit lines and a single source line in a conventional architecture of the type shown in FIG. 1.

Furthermore, as the control CG and selection SG gates have the same electric potential as they are formed by the same polysilicon layer (26), it is not possible to apply different voltages to them to optimize the injection performance with the efficiency offered by a conventional split gate memory cell of the type represented in FIG. 1.

Finally, the gate oxide 200a that covers the trench is formed at the same time as a lateral oxide 200b that isolates the selection gate SG from the floating gate FG. It is not therefore possible to separately control the thickness of the gate oxide 200a and that of the lateral oxide 200b. This manufacturing method thus offers little flexibility for the control of the electrical characteristics of the memory cell, in particular its injection performance, its threshold voltage in the vertical channel region L1, and its breakdown voltage.

It could thus be desirable to provide an enhanced split gate memory cell structure, and a method of manufacturing such a memory cell.

BRIEF SUMMARY

Some embodiments of the present disclosure thus relate to a memory cell formed on a semiconductor substrate, comprising a vertical selection gate extending in a trench made in the substrate, a floating gate extending above the substrate, and a horizontal control gate extending above the floating gate, wherein the floating gate also extends above a portion of the vertical selection gate, over a non-zero overlap distance.

According to one embodiment, the trench is covered with a dielectric layer comprising a thicker region near the surface of the substrate.

According to one embodiment, the floating gate has a protuberance which extends beneath the surface of the substrate in the thicker region of the dielectric layer, and has a face opposite a portion of the vertical selection gate.

According to one embodiment, the memory cell comprises a vertical channel region extending opposite the selection gate and electrically linked to an embedded layer forming a collective source plane for collecting programming currents for programming the memory cell and memory cells formed on the same substrate.

Some embodiments of the present disclosure also relate to a group of memory cells comprising a first and a second memory cell according to the present disclosure, sharing the same vertical selection gate.

Some embodiments of the present disclosure also relate to a memory circuit, comprising a memory array comprising a plurality of memory cells.

Some embodiments of the present disclosure also relate to a memory circuit comprising a memory cell according to the present disclosure, and means for programming the memory cell by hot-electron injection configured to apply electric potentials to the substrate, to the vertical selection gate, to the horizontal control gate and to drain and source regions of the memory cell, such that electrons circulate in a vertical channel region extending opposite the selection gate and are injected into the floating gate in an injection zone situated in a horizontal channel region extending opposite the floating gate.

Some embodiments of the present disclosure also relate to a memory circuit comprising a memory cell according to the present disclosure and means for erasing the memory cell by tunnel effect configured to apply electric potentials to the vertical selection gate and the horizontal control gate of the memory cell, such that electric charges are extracted from the floating gate and collected by the vertical selection gate through the protuberance of the floating gate and the dielectric material extending between the protuberance and the vertical selection gate.

Some embodiments of the present disclosure also relate to a method of manufacturing on a semiconductor substrate an electrically programmable memory cell, comprising the steps of: etching a trench in the substrate, depositing in the trench a first dielectric layer, depositing on the substrate a first conductive layer and etching the first conductive layer to form a vertical selection gate extending in the trench, depositing on the substrate a second dielectric layer, depositing on the second dielectric layer a second conductive layer, and etching the second conductive layer so as to form a floating gate, the second conductive layer being etched so that the floating gate partially overlaps the vertical selection gate over a non-zero overlap distance.

According to one embodiment, the second conductive layer is etched from a photolithography layout defining between the proximal edge of the floating gate and the corresponding proximal edge of the vertical selection gate a theoretical overlap distance at least equal to a photolithography tolerance of the manufacturing method.

According to one embodiment, the method comprises a preliminary step of implanting in the substrate a conductive plane forming a source line for the memory cell.

According to one embodiment, the method comprises a step of producing in the dielectric layer covering the trench, a thicker region situated near the surface of the substrate.

According to one embodiment, the method comprises a step of making a hollow in the thicker region of the dielectric layer.

According to one embodiment, the hollow is formed so as to extend beneath the surface of the substrate and so that the floating gate has a protuberance extending in the hollow and having a face opposite a portion of the vertical selection gate.

According to one embodiment, the method comprises steps of depositing a third dielectric layer on the second conductive layer and of depositing a third conductive layer on the third dielectric layer, and a step of simultaneously etching the third conductive layer and the second conductive layer, to form a horizontal control gate on the floating gate.

Some embodiments of the present disclosure also relate to a method of manufacturing an integrated circuit on a semiconductor wafer, including the method of manufacturing a memory cell according to the present disclosure.

BRIEF DESCRIPTION OF THE SEVERAL VIEWS OF THE DRAWINGS

These objects and features of the present disclosure will be better understood in the light of the following description of embodiments of a method of manufacturing a memory cell according to the present disclosure, and of examples of memory cells produced according to this method, given in relation with, but not limited to, the following figures in which.

DETAILED DESCRIPTION

FIGS. 4 to 18 are cross-sections showing steps of a method of manufacturing a memory cell according to the present disclosure. FIGS. 13A and 13B show two alternatives of a step of this method. FIGS. 14A to 14C and 15A to 15C show three alternatives of two other steps of this method. FIGS. 19A to 19C show the three alternatives C31, C32, C33 of a memory cell C3 according to the present disclosure produced with this method and its alternatives.

The memory cell C3 (C31, C32, C33) shown in FIGS. 19A, 19B, 19C comprises a floating gate FG formed on a substrate PW, a horizontal control gate CG extending over the floating gate FG, and a selection gate SG formed in a trench 10 made in the substrate, the trench being covered with a dielectric layer D1. The memory cell C3 is here produced at the same time as a twin memory cell C3' (C31', C32', C33') using the same selection gate SG.

According to the present disclosure, the floating gate FG extends above a portion of the selection gate SG. The distance Dov between the proximal edge of the floating gate FG and the corresponding proximal edge of the selection gate SG is here negative, and is referred to as "overlap distance" below.

The alternatives C31, C32 (FIGS. 19A, 19B) of the memory cell C3 further comprise, in the dielectric layer D1, a thicker region D1', situated near the surface of the substrate PW. In the embodiment represented, the thickness of the region D1' increases as it approaches the surface of the substrate and, seen in cross-section, it has a profile substantially in the shape of a "V", the dielectric layer D1 having a corresponding profile substantially in the shape of a "Y". As a numerical example, the dielectric layer D1 has a thickness in the order of 5 to 10 nm (nanometers), and the region D1' has a thickness in the order of 15 to 20 nm without its portion close to the surface of the substrate.

Furthermore, the lower face of the floating gate FG of the alternative C31 of the memory cell C3 comprises a protuberance p15 which extends beneath the surface of the substrate PW, in the region D1' of the layer D1, and has a face opposite a portion of the selection gate SG.

Figure 4:
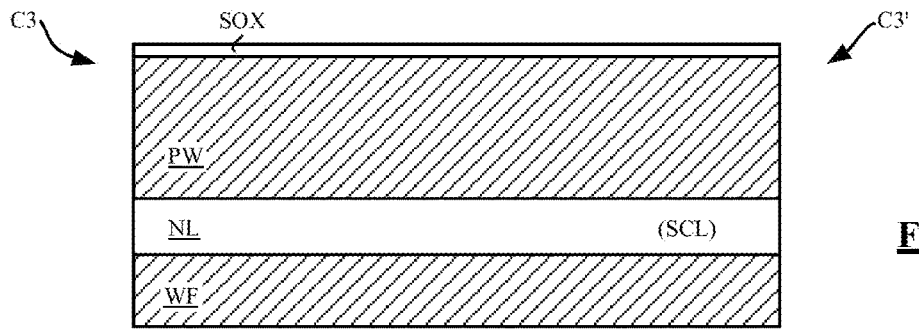

FIG. 4 shows a preliminary stage of producing the memory cell C3. A deep doped layer NL has been implanted in a semiconductor substrate wafer WF. This layer is for example the N-type isolation layer of a P-type well forming the substrate PW in which the memory cell is produced. This layer will serve as source line SCL for all the memory cells implanted in the substrate PW, more precisely a collective source plane, capable of collecting the programming currents for programming several memory cells. STI-type (Shallow Trench Isolation) shallow isolating trenches, not visible in FIG. 4 because they are situated in a cutting plane parallel to that of the figure, may have been made on the surface of the substrate, in the framework of collective manufacturing of several rows of memory cells. A sacrificial oxide layer SOX has then been deposited on the surface of the substrate PW.

Figure 5:
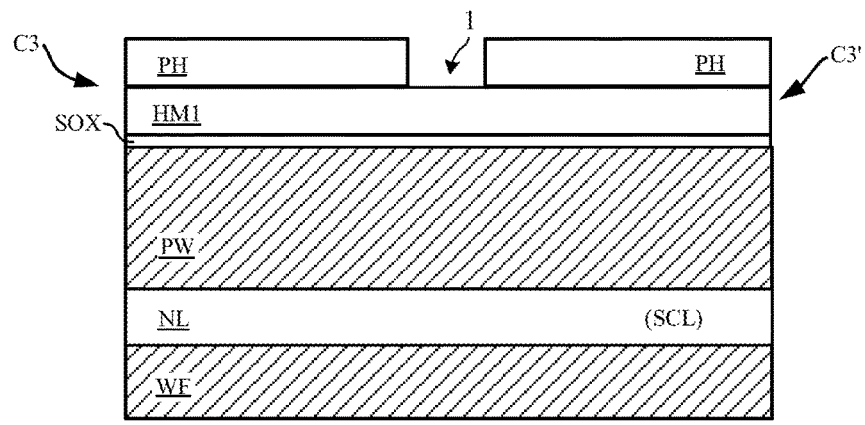

During a step shown in FIG. 5, a hard mask HM1 is formed on the oxide layer SOX, by depositing or growing one or more solid layers, for example made of silicon oxide or silicon nitride or a combination of these materials. A light-sensitive resin mask PH is then deposited on the mask HM1, and then developed so as to form an opening 1 in the mask PH.

Figure 6:
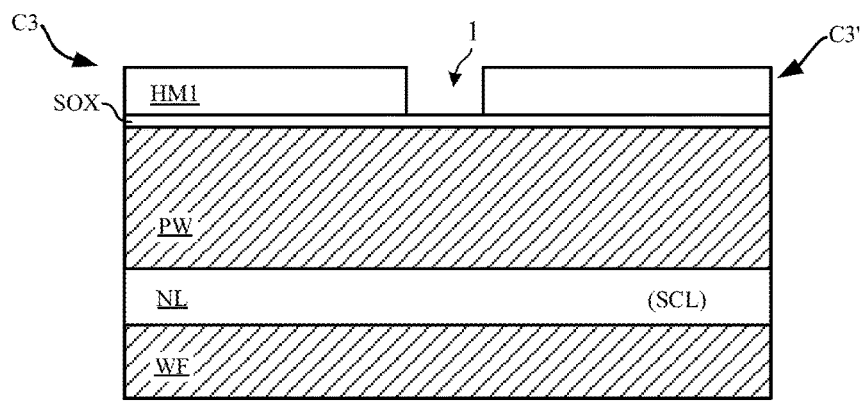

During a step the result of which is shown in FIG. 6, the mask HM1 has been etched through the resin mask PH so as to form a corresponding opening 1 in the mask HM1, and the mask PH has then been removed.

Figure 7:
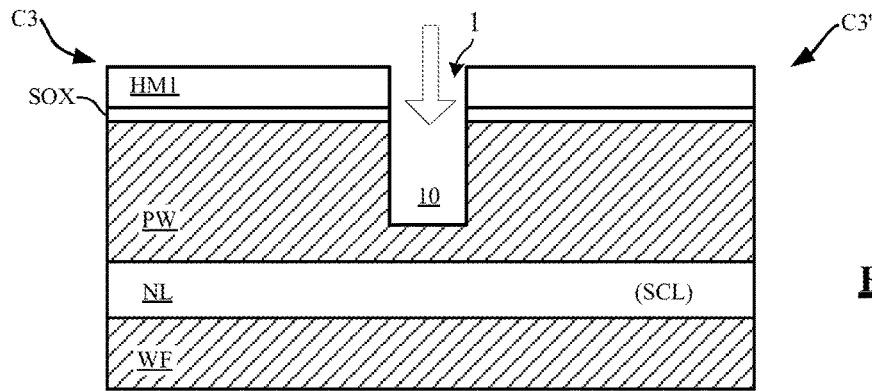

During a step shown in FIG. 7, the trench 10 is formed in the substrate PW by etching the latter through the opening 1 of the mask HM1. The etching method used is preferably a non-selective and anisotropic dry etching method, such as a plasma etching method. The depth of the trench is here less than the depth of implantation of the doped layer NL. As a numerical example, the trench has a depth of 450 nm and the layer NL is implanted at 750 nm from the surface of the substrate.

Figure 8:
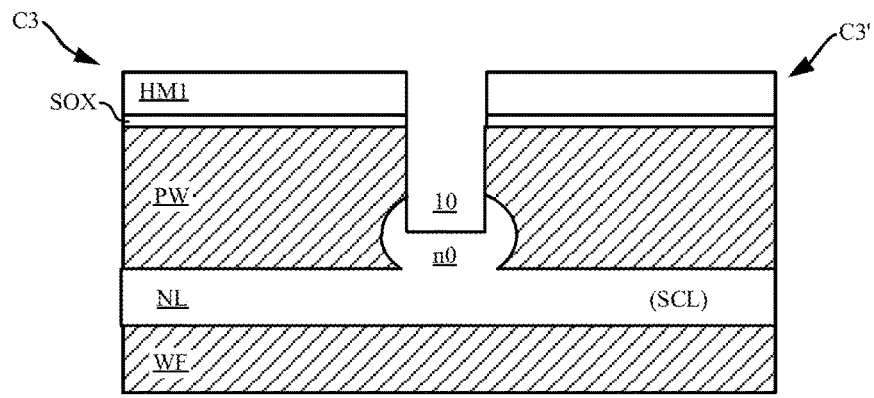

During a step shown in FIG. 8, a deep doped pocket n0 is implanted in the substrate through the trench 10, in the vicinity of the bottom of the trench 10. The pocket n0 extends up to the doped layer NL and will be used as source region for the memory cell being formed, whereas the doped layer NL will be used as source line SCL in the continuation of the source region n0. In one alternative embodiment, the pocket n0 is not implanted and the trench 10 is etched to a greater depth so as to reach the layer NL, which will then be used as source region and source line.

Figure 9:
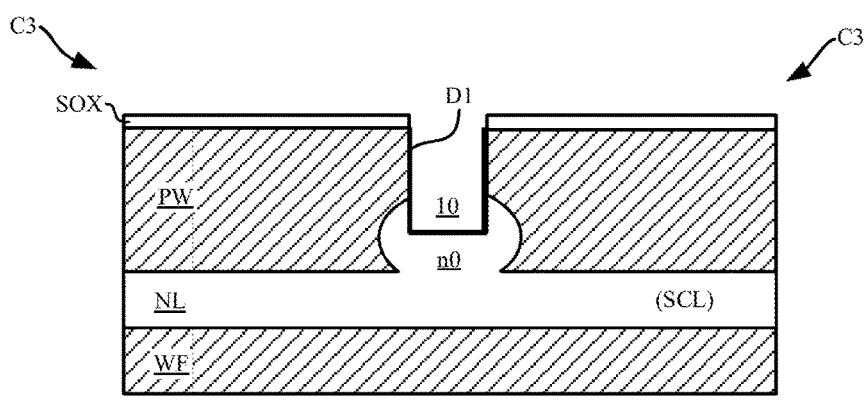

During a step shown in FIG. 9, the dielectric layer D1 is formed on the walls of the trench 10, for example by growing oxide.

Figure 10:
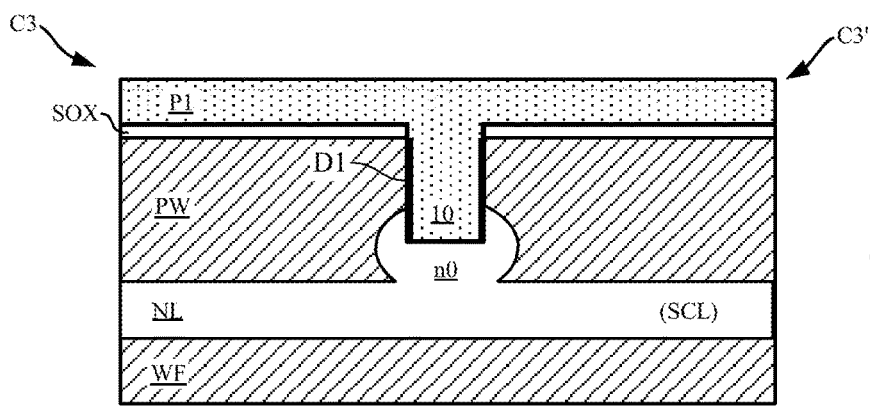

During a step shown in FIG. 10, a conductive layer P1, for example made of polysilicon, is deposited on the entire substrate, as well as inside the trench 10.

Figure 11:
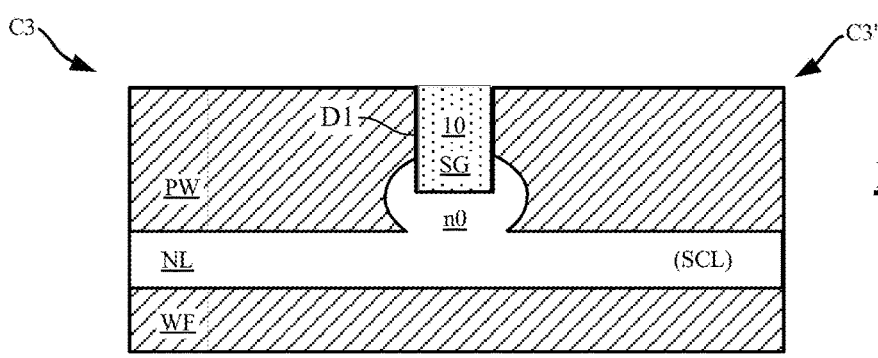

During a step shown in FIG. 11, the layer P3 is etched so as not to remain on the surface of the substrate, except inside the trench 10 where it forms the selection gate SG. This step includes the simultaneous etching of the sacrificial oxide layer SOX, or is followed by a step of wet etching the layer SOX.

Figure 12:
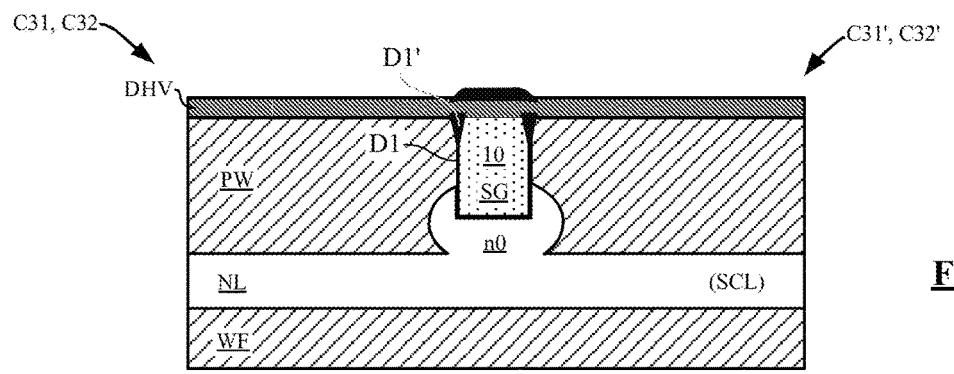
Figure 13A:
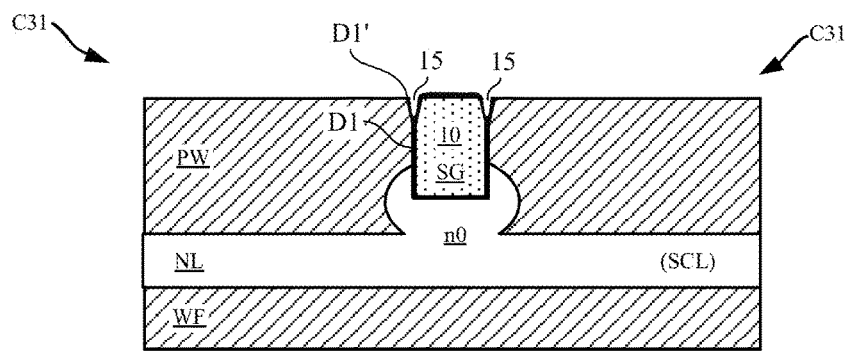
Figure 13B:
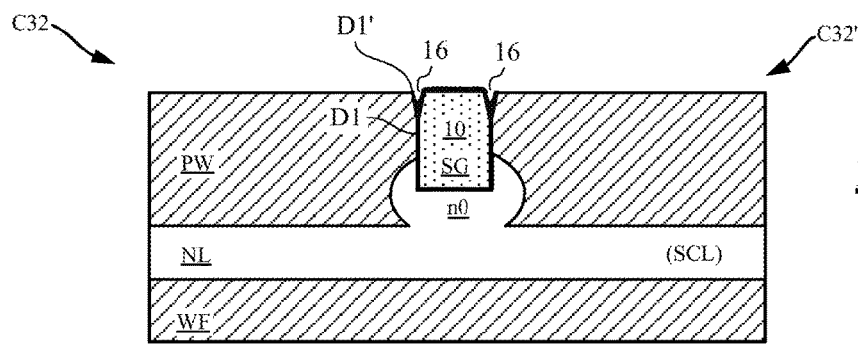

Next steps, shown on FIGS. 12, 13A, 13B, produce the thicker region D1' in the dielectric layer D1 of the cells C31 (FIG. 19A) and C32 (FIG. 19B).

In the step shown in FIG. 12, a high voltage dielectric layer DHV is deposited on the entire substrate, here by growing a thermal oxide such as silicon dioxide $SiO_2$, for example over a thickness in the order of 10 to 15 nm. This deposit can be carried out in one or more steps and the oxide formed partly comes from the oxidation of the material forming the substrate PW, here silicon. This oxidation produces the region D1' in the vicinity of the surface of the substrate, firstly by oxidation of the material of the substrate which is opposite the trench 10, here silicon, and secondly by oxidation of the material forming the vertical gate SG, here polysilicon. An equal oxidation of the silicon and of the polysilicon on either side of the dielectric layer D1 leads to the substantially V shape of the region D1'. The duration of this oxidation step, the thickness of the layer DHV, and the conditions of its implementation enable the depth and the width of the region D1' to be controlled.

It will be noted that this step is optional in relation to the method of manufacturing the memory cell, but can be desirable in the framework of the simultaneous production of high voltage transistors present in other parts of the circuit into which the memory cell is integrated.

In the step shown on any one of FIGS. 13A, 13B, the dielectric layer DHV is removed by etching, for example by means of a so-called "BOE" technique ("Buffered Oxide Etch") using hydrofluoric acid (HF). This entails a partial removal of the dielectric from the region D1', leading to the appearance of a hollow 15 (FIG. 13A) or a hollow 16 (FIG. 13B) the depth of which depends on the conditions in which this etching step is implemented, and can be controlled by those skilled in the art. Thus, in the examples of embodiments represented, the region D1' of the memory cell C31 being formed (FIG. 13A) has a hollow 15 which extends opposite the embedded gate SG, beneath the surface of the substrate. The hollow is here in the form of a tip, due to the "V" shape of the region D1'. However, the region D1' of the memory cell C32 being formed (FIG. 13B) only has a superficial hollow 16.

Figure 14A:
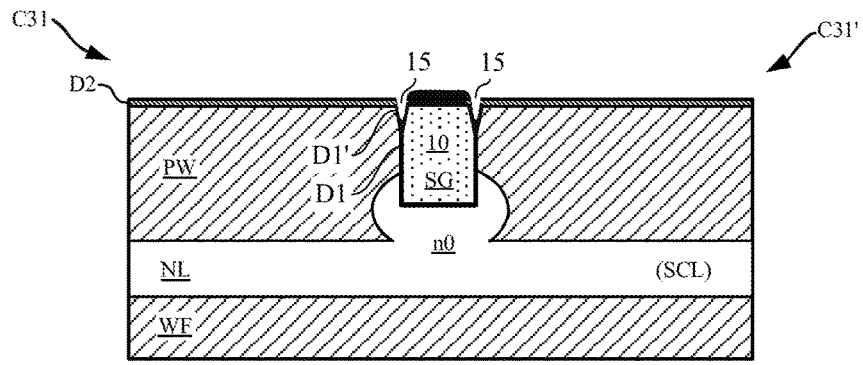
Figure 14B:
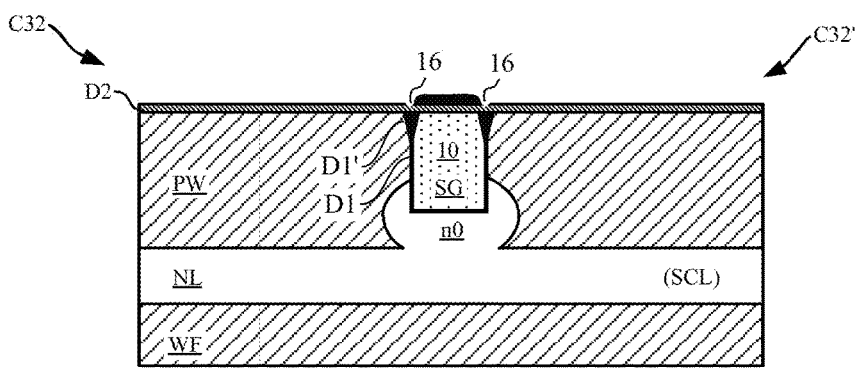
Figure 14C:
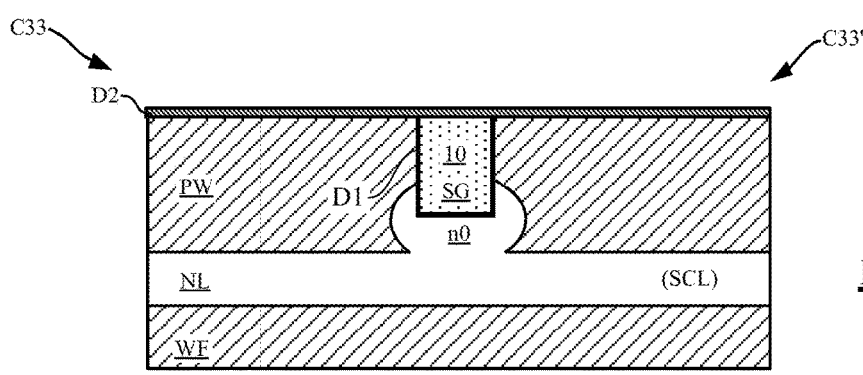

In the step shown on any one of FIGS. 14A, 14B, 14C, a tunnel dielectric layer D2, for example silicon oxide, is deposited on the entire substrate, for example over a thickness in the order of 7 to 10 nm.

FIG. 14A shows the profile of the region D1' after depositing the dielectric layer D2 on the memory cell being formed C31. The hollow 15 is only partially filled by the dielectric D2 and still extends opposite the embedded vertical gate SG, beneath the surface of the substrate. FIG. 14B shows the profile of the region D1' after depositing the dielectric layer D2 on the memory cell being formed C32. The superficial hollow 16 is almost completely filled by the dielectric D2. FIG. 14C shows the profile of the layer D2 after it has been deposited on the memory cell being formed C33. The substrate of the memory cell C33, as shown in FIG. 11, has not undergone the step of depositing high voltage dielectric and thus does not comprise the region D1'.

Figure 15A:
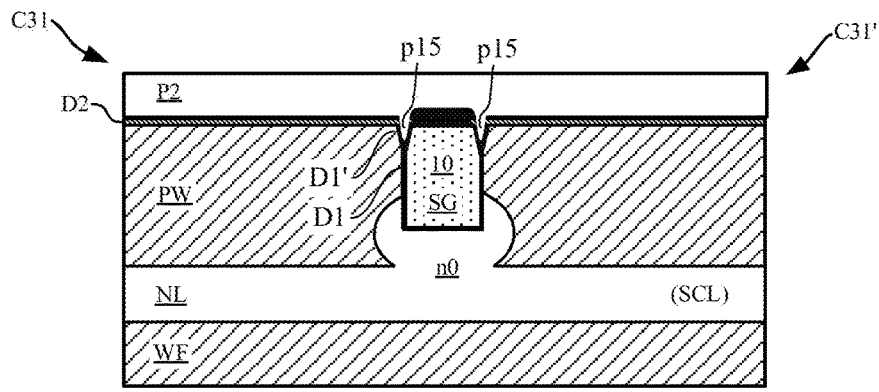
Figure 15B:
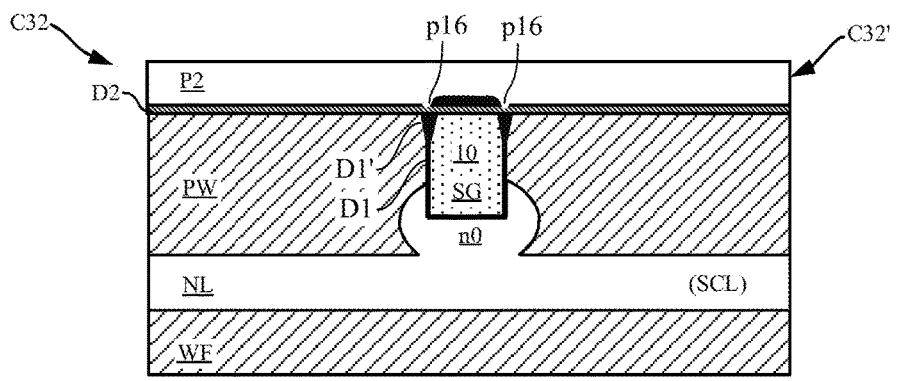
Figure 15C:
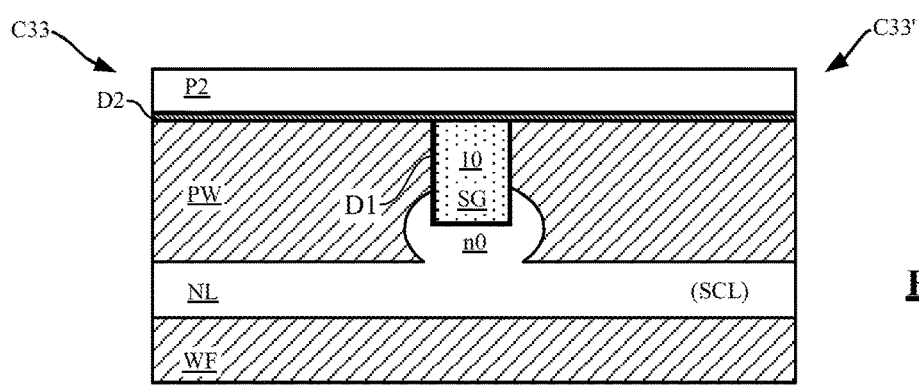

In the step shown on any one of FIGS. 15A, 15B, 15C, a conductive layer P2, for example made of polysilicon, is deposited on the entire substrate.

FIG. 15A shows the profile of the layer P2 after being deposited on the memory cell being formed C31. The lower face of the layer P2 has the above-mentioned protuberance p15 which extends in the hollow 15 beneath the surface of the substrate, and has a face opposite a portion of the selection gate SG. FIG. 15B shows the profile of the layer P2 after being deposited on the memory cell being formed C32. The lower face of the layer P2 has a protuberance p16 the extent of which is slight and which extends in the superficial hollow 16. FIG. 15C shows the profile of the layer P2 after being deposited on the memory cell being formed C33. In this embodiment, the lower face of the layer P2 has no irregularity. Below, the protuberance p16 will be considered insignificant and the memory cell C32 will be considered equivalent to the memory cell C33.

Figure 16:
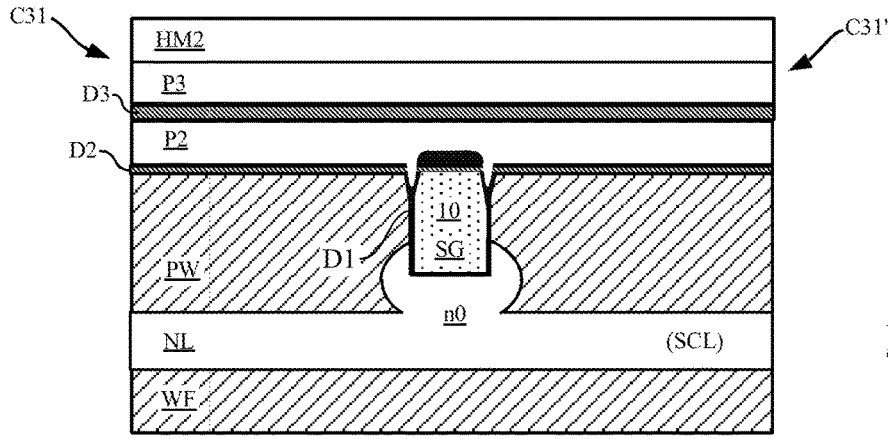
Figure 17:
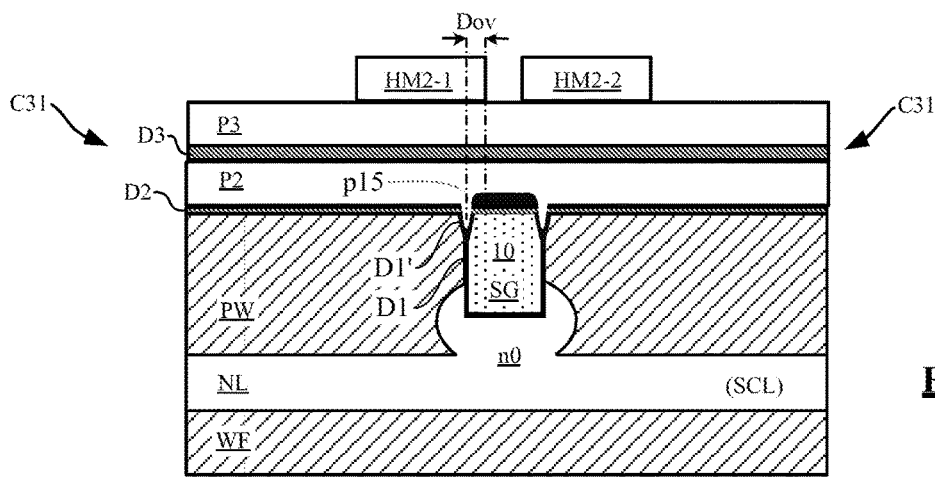
Figure 18:
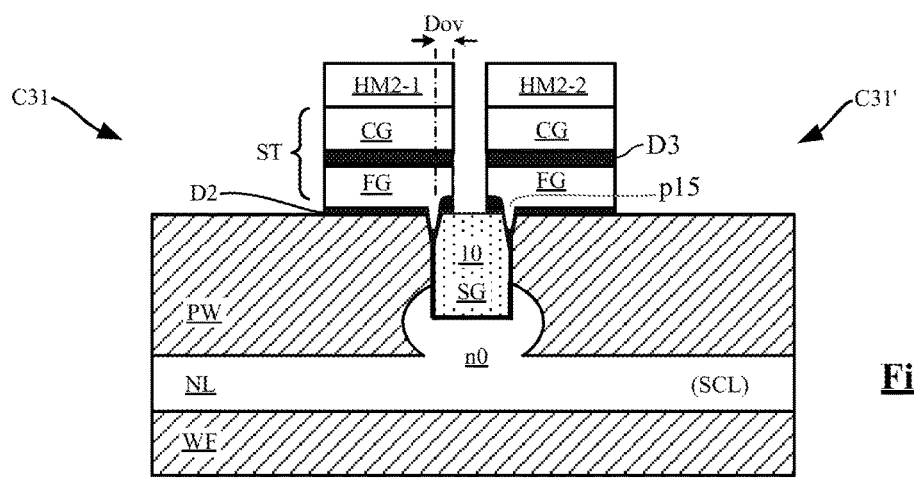
Figure 19A:
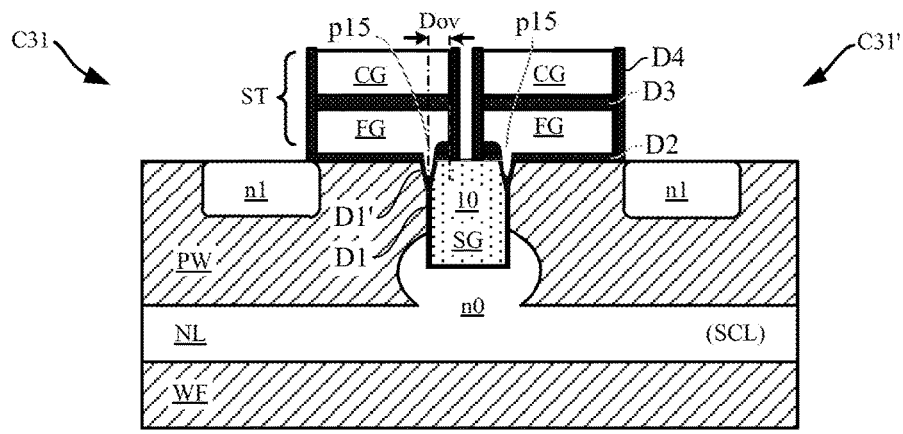
FIGS. 19A to 19C show memory cells produced with this method.
Figure 19B:
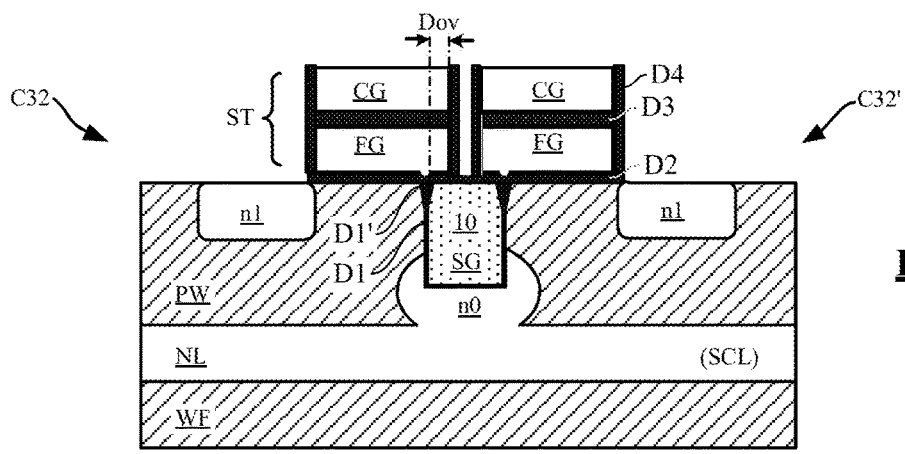
Figure 19C:
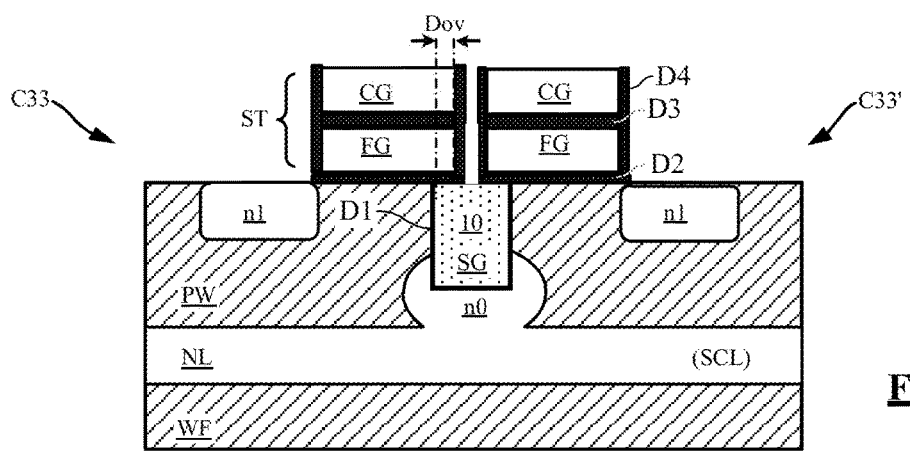

FIGS. 16, 17 and 18 show next steps of manufacturing the cell C3. The memory cell represented is the cell C31 but these steps are also applied to the memory cells C32, C33, that are not represented for the sake of simplicity.

In the step shown in FIG. 16, the layer D2 is covered with a dielectric layer D3, for example a so-called "interpoly" ONO-type oxide (oxide-nitride-oxide). The layer D3 is then covered with a conductive layer P3, here made of polysilicon, and the layer P3 is then covered with a hard mask HM2.

In the step shown in FIG. 17, the hard mask HM2 is etched by photolithography so as to keep only two portions of mask HM2-1, HM2-2 corresponding to the gate stack FG/CG to be produced.

In the step shown in FIG. 18, the layers D2, P2, D3 and P3 are etched by anisotropic dry etching. The regions protected by the portions of mask HM2-1, HM2-2 are not etched and form the gate stack FG/CG comprising the tunnel dielectric layer D2, the floating gate FG, the dielectric layer D3, and the control gate CG.

The positioning of the portions of mask HM2-1, HM2-2 determines the position of the gate stack FG/CG in relation to the vertical gate SG. This positioning is determined when designing the photolithography layout of the memory cell.

For this purpose, the designer defines a theoretical overlap distance Dovt corresponding to the targeted overlap distance Dov taking into account a tolerance "T" of the manufacturing method. The overlap distance obtained Dov is equal to the theoretical overlap distance Dovt plus or minus this tolerance, and thus ranges in the open interval ]Dovt−T; Dovt+T[ (the tolerance T considered here being a limit error that is deemed not reached by the manufacturing method).

According to one embodiment, the theoretical overlap distance is Dovt=T, to obtain an overlap distance Dov within the interval ]0; 2T[. In other words, the memory cells produced have, between the proximal edge of the gate stack FG/CG and the corresponding proximal edge of the vertical gate SG, an overlap distance Dov ranging from a value close to zero to a value close to 2T, the value close to zero corresponding to an almost perfect alignment of the gate stack with the vertical gate SG.

As an example, with a manufacturing method enabling a floating gate FG to be produced with a length in the order of 120 to 150 nm, a typical tolerance value T is in the order of 20 nm, and the width of the vertical gate SG is in the order of 150 to 300 nm. The overlap distance Dov is then within the interval of 0-40 nm.

FIGS. 19A, 19B, 19C described above represent the three alternatives C31, C32, C33 of the memory cell C3 obtained after steps of finalizing the manufacturing method, such as removing the portions of mask HM2-1, HM2-2 and depositing a lateral dielectric layer D4 on the vertical walls of the gate stack FG/DG.

Figure 20:
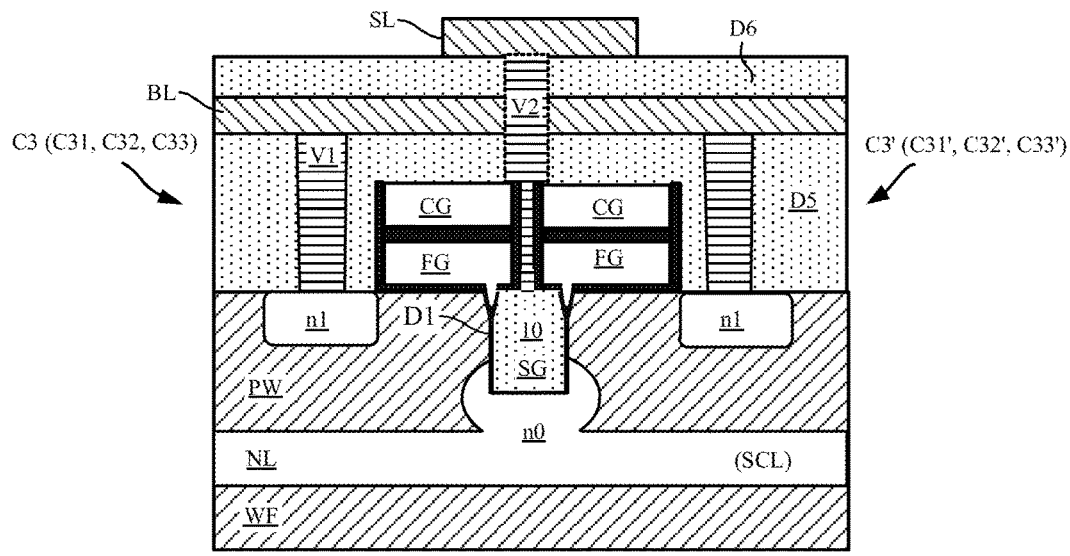
FIGS. 20 and 21 show complementary steps of manufacturing an integrated circuit comprising a memory cell according to the present disclosure.

These steps can be followed by complementary steps that produce a fully integrated circuit. For example, as shown in FIG. 20, the regions n1 of the twin cells C3, C3' can be linked to a bit line BL produced in a first level of metal or "metal 1", through a conductive via V1 passing through a dielectric layer D5 covering the memory cells. Similarly, the selection gate SG can be linked to a selection line SL formed in a second level of metal or "metal 2" through a set of conductive vias V2 passing through the dielectric layer D5 and through a dielectric layer D6 covering the level of metal "metal 1".

Figure 21:
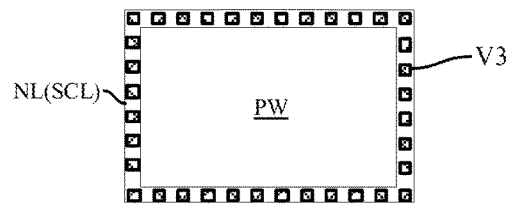

As shown in FIG. 21, the doped layer NL as source line SCL, here a source plane, can be linked by conductive vias V3 to a set of surface contacts enabling a source line potential to be applied to the layer NL.

Figure 22:
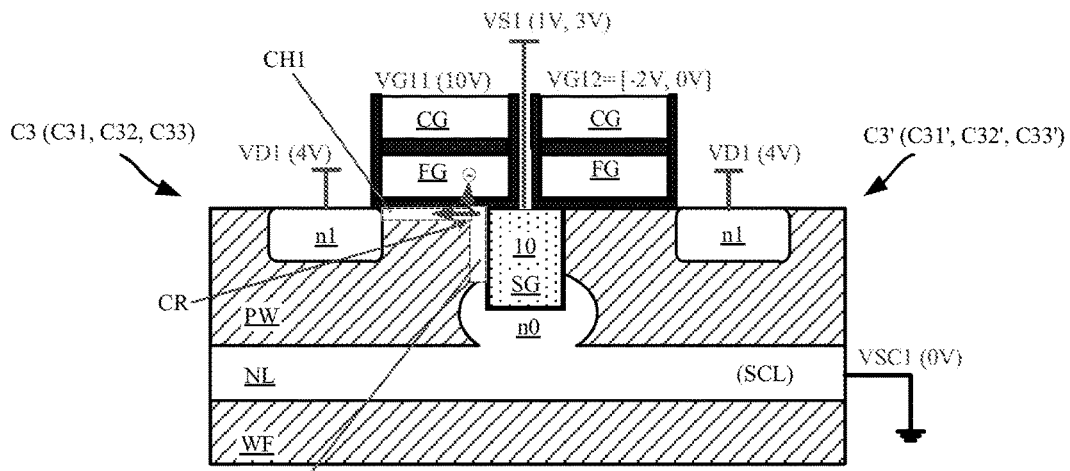
FIG. 22 shows a method of programming a memory cell according to the present disclosure.

FIG. 22 shows a method of programming the memory cell C3 by hot-electron injection. The memory cell represented is the cell C33 but the method is applicable to the other alternatives C31, C32 of the memory cell. The region n1 forms a drain region and receives a positive drain voltage VD1, for example 4V. The control gate CG receives a positive programming voltage VG11, for example 10V. The selection gate SG receives a positive selection voltage VS1, for example between 1 and 3V. The doped layer NL receives a zero-value source voltage VSC1 (ground of the circuit). The twin memory cell C3', that is connected to the same bit line and thus also receives the voltage VD1, receives on its control gate CG a negative or zero program-inhibit voltage VG12, for example between −2V and 0V.

The bias of the gates CG, SG causes the appearance in the memory cell C3 of a horizontal channel region CH1 extending beneath the floating gate FG, of a vertical channel region CH2 extending opposite the selection gate SG, and of a region CR common to the channel regions CH1, CH2, enabling the latter to cooperate in the hot-electron injection programming process. A current circulates from the drain (n1) to the source (n0) of the memory cell. A flow of electrons circulates in the opposite direction to this current.

The flow of electrons passes through the vertical channel region CH2 extending opposite the gate SG, passes through the common region CR beneath the floating gate, then passes through the channel region CH1 to join the drain region n1. Hot electrons present in the flow of electrons are injected into the floating gate FG, under the effect of a transverse electric field created by the voltage VG11, in an injection zone located in the channel region CH2 and more particularly in the common region CR or near the latter.

Figure 23:
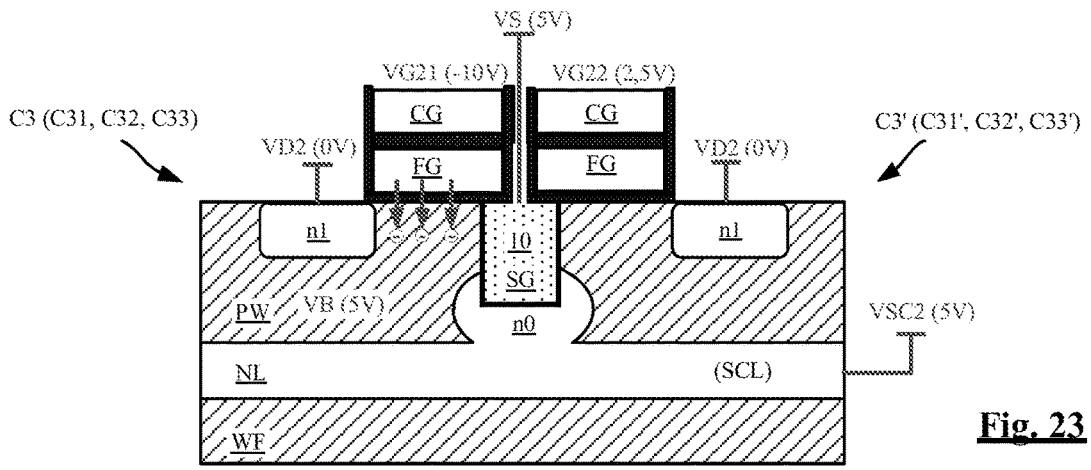
FIG. 23 shows a method of erasing a memory cell according to the present disclosure.

FIG. 23 shows a channel erase method of erasing the memory cell C3. The memory cell represented is the cell C33 but the method is applicable to the alternatives C31, C32 of the memory cell. The region n1 receives a zero-value drain voltage VD2. The control gate CG receives a negative erase voltage VG21, for example −10V. The selection gate SG receives a positive selection voltage VS2, for example 5V. The doped layer NL receives a positive source voltage VSC2, for example 5V. The substrate PW is thus taken to a voltage VB equal to the voltages VS2 and VSC2, for example 5V. Electrons are extracted from the floating gate FG through the substrate and are collected by the source line NL/SCL. The twin memory cell C3' receives on its control gate CG a positive erase-inhibit voltage VG22, for example 2.5V.

Figure 24:
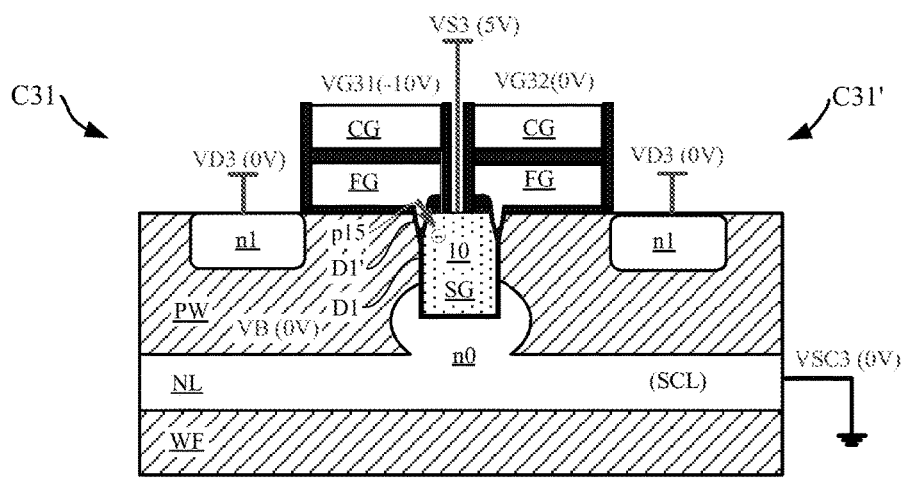
FIGS. 24 and 25 show another method of erasing a memory cell according to the present disclosure.

FIG. 24 shows an erasing method according to the present disclosure for erasing the memory cell C31, performed through the vertical gate SG. This method is applicable only to the cell C31 and uses the protuberance p15 of the floating gate FG. The region n1 receives a zero-value drain voltage VD3. The control gate CG receives a negative erase voltage VG31, for example −10V. The selection gate SG receives a positive selection voltage VS3, for example 5V. The doped layer NL here receives a zero-value source voltage VSC3. The voltage VB of the substrate PW is thus zero. The twin memory cell C33' receives on its control gate CG an erase-inhibit voltage VG32 that is not necessarily positive and can be zero due to the fact that the voltage VB is itself zero.

Figure 25:
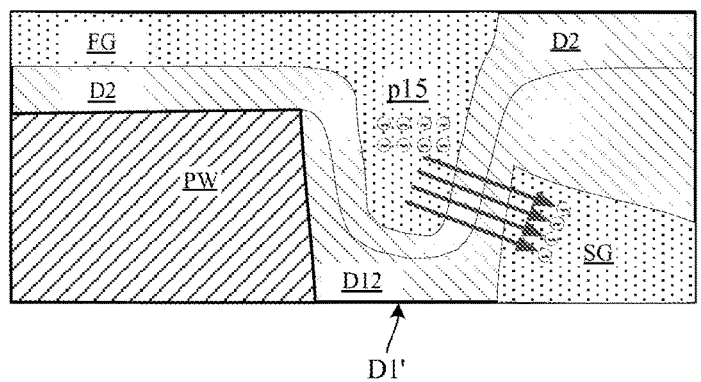

Under the effect of the voltage VS3, electrons are extracted from the floating gate FG by the vertical gate SG, and are collected by the word line to which the latter is connected. This process is shown in greater detail in FIG. 25. Between the protuberance p15 and the vertical gate SG extends a dielectric material that is part of the region D1' and which partly comprises dielectric material of the dielectric layer D2, and a composite dielectric material D12 that comprises the original dielectric material of the layer D1 combined with remainders of the high voltage dielectric material DHV. The distance between the protuberance p15 and the gate SG, in the order of a few tens of nanometers, enables the tunnel effect to appear between these two elements.

This gate SG erase method has various advantages in relation to the channel erase method. In particular, the erasing is not performed through the same dielectric region as the programming, which decreases the electrical stress of the dielectric material and its ageing. Furthermore, the twin memory cell does not undergo any erase stress (slow spurious erasure) due to the fact that the substrate voltage remains zero, unlike the channel erase method.

Figure 2:
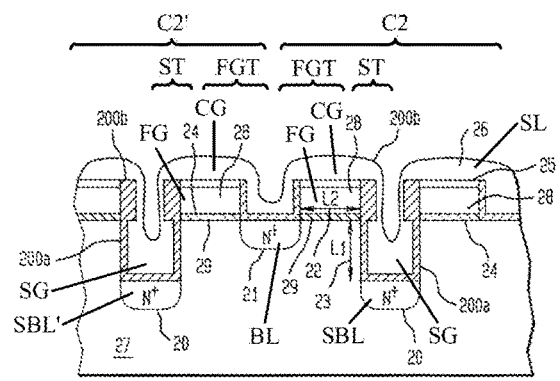
Figure 3:
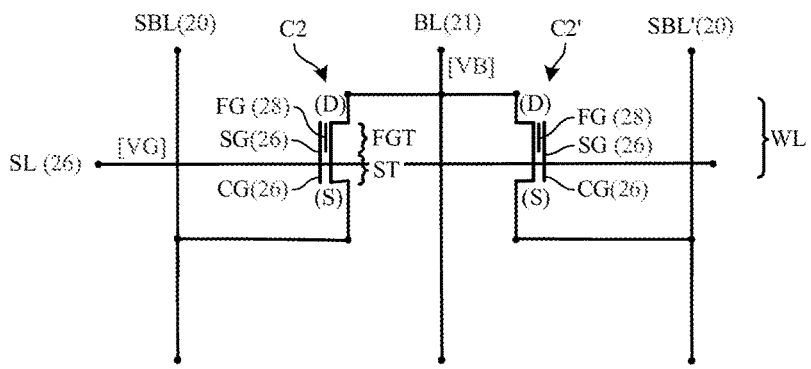

It will be noted that the cutting plane in FIG. 20, and generally speaking the cutting plane in FIGS. 4 to 19, 22 to 25, is perpendicular to the cutting plane in FIG. 2. In FIG. 20, the bit line BL is parallel to the cutting plane whereas the bit line (21) in FIG. 2 is perpendicular to the cutting plane. Similarly, the selection line SL is perpendicular to the cutting plane in FIG. 20 and the selection line, formed by the gate material (26), is parallel to the cutting plane in FIG. 2. Lastly, the multiple "source bit lines" (20) in the memory cell structure in FIG. 2 are replaced, for a memory cell structure according to the present disclosure, with the doped layer NL forming a source line SCL and more precisely a source plane for all the memory cells implanted in the same well PW, and capable of collecting the programming currents for programming several memory cells. The memory cell structure according to the present disclosure thus leads to a simpler hot-electron injection programmable memory array architecture than the architecture of the memory cell structure in FIG. 2.

Figure 26:
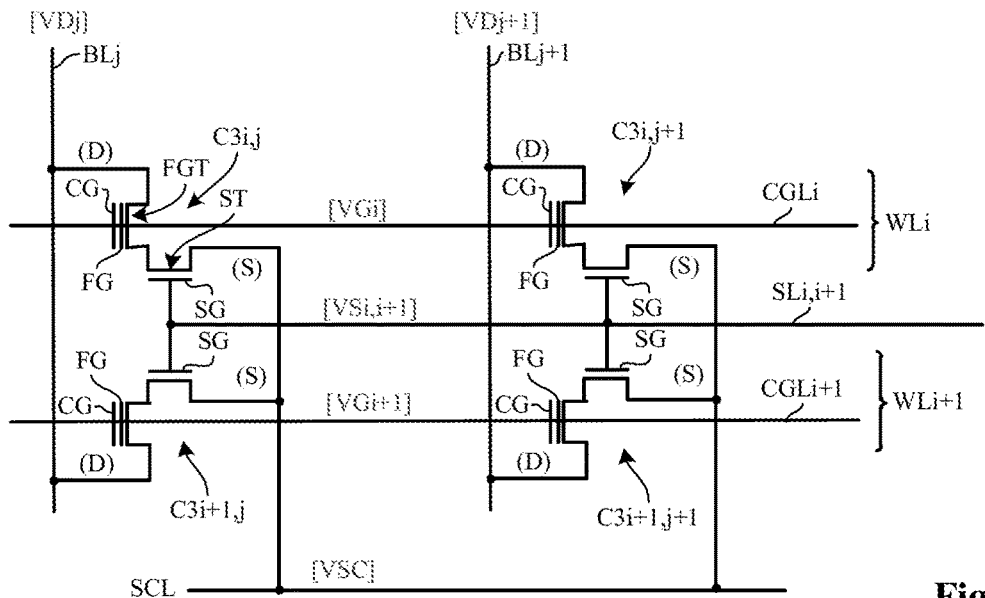
FIG. 26 shows a memory array architecture comprising a memory cell according to the present disclosure.

FIG. 26 shows such a memory array architecture. Only two pairs of twin memory cells $C3_{i,j}$, $C3_{i+1,j}$ are represented, respectively $C3_{i,j+1}$, $C3_{i+1,j+1}$. The memory cells $C3_{i,j}$, $C3_{i,j+1}$, belong to a word line $WL_i$ and the memory cells $C3_{i+1,j}$, $C3_{i+1,\ j+1}$ belong to a twin word line $WL_{i+1}$. The selection gates SG of the selection transistor ST sections of the memory cells are linked to the same selection line $SL_{i,j+1}$ and the sources S of the four memory cells are linked to the same source line SCL (formed by the embedded layer NL). The control gates CG of the floating-gate transistor FGT sections of the memory cells $C3_{i,j}$ and $C3_{i+1,j}$ are connected to a control gate line $CGL_i$, and the control gates CG of the memory cells $C3_{i+1,j}$ and $C3_{i+1,j+1}$ are connected to a control gate line $CGL_{i+1}$. The drains of the twin memory cells $C3_{i,j}$, $C3_{i+1,j}$ are linked to a bit line $BL_j$ and the drains of the twin memory cells $C3_{i,j+1}$, $C3_{i+1,j+1}$ are linked to a bit line $BL_{j+1}$.

The memory array thus only comprises one bit line per vertical row of memory cells. Each word line $WL_i$, $WL_{i+1}$ only comprises one control gate line $CGL_i$, $CGL_{i+1}$ and one selection line $SL_{i,i+1}$ common to the twin word line. The bit line $BL_j$ receives a drain voltage $VD_j$ and the bit line $BL_{j+1}$ receives a drain voltage $VD_{j+1}$. The control gate line $CGL_i$ receives a gate voltage $VG_i$ and the control gate line $CGL_{i+1}$ receives a gate voltage $VG_{i+1}$. The selection line $SL_{i,j+1}$ receives a selection voltage $VS_{i,j+1}$. The common source line SCL, here a source plane, receives the source voltage VSC.

Figure 1:
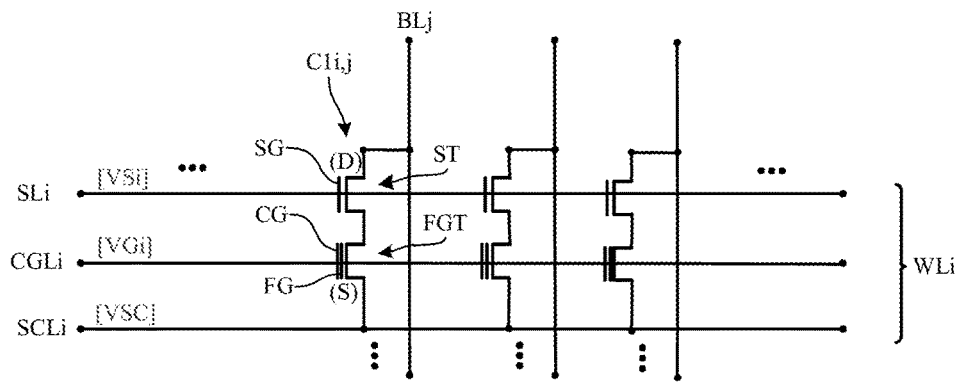
FIG. 1 described above shows a conventional memory array architecture comprising split gate memory cells, FIG. 2 described above is a cross-section of a conventional split gate memory cell having a vertical selection gate, FIG. 3 described above shows a memory array architecture receiving the memory cell in FIG. 2, FIGS. 4 to 18 are cross-sections showing steps of a method of manufacturing a memory cell according to the present disclosure.

The memory array thus comprises a small number of interconnection lines and its structure is similar to that of a memory array of the type shown in FIG. 1, while benefiting firstly from the advantage offered by a memory cell having a vertical selection transistor section, in terms of footprint, and secondly from the advantage offered by having distinct control and selection gates for the optimization of the programming process.

It will be understood by those skilled in the art that the method according to the present disclosure is susceptible of various other alternative embodiments and applications. In particular, although the description above was of the formation of two twin memory cells, one embodiment of the method according to the present disclosure can aim to produce "unit" memory cells, i.e., without any twin memory cell sharing the same vertical selection gate SG.

Figure 27:
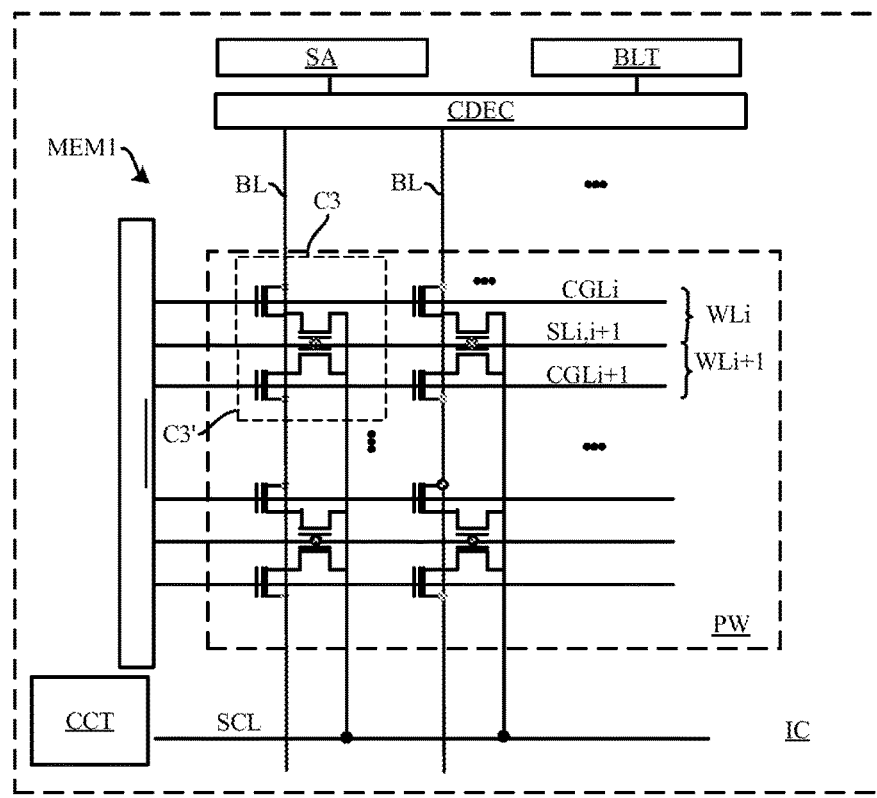
FIG. 27 shows an example of a memory circuit comprising memory cells according to the present disclosure.

Conversely, some embodiments may include the collective and simultaneous production of one or more rows of twin memory cells, for example in the framework of the production of an electrically programmable and erasable memory circuit MEM1 of the type shown in FIG. 27.

The circuit MEM1 is fabricated on a semiconductor wafer and forms an integrated circuit IC. It comprises twin word lines $WL_i$, $WL_{i-i}$ of the type shown in FIG. 26, fabricated on the substrate PW, two twin word lines $WL_i$, $WL_{i+1}$ comprising twin memory cells sharing the same selection line $SL_{i,j+1}$. The selection lines SL and the control gate lines CGL are linked to a word line decoder WLDEC which applies memory cell erase, program and read voltages thereto. The bit lines BL connected to the drain regions n1 of the memory cells are linked to a set of programming latches BLT and to a set of sense amplifiers SA through a column decoder CDEC. These elements are linked to a control circuit CCT which ensures the sequencing of programming and erasing operations conforming to one of the methods described above.

It will be understood by those skilled in the art that a memory cell according to the present disclosure is susceptible of being produced in other fields of technology, the materials mentioned in the description above, in particular the silicon, silicon dioxide and polysilicon, being merely examples.

Similarly, the method described above, of forming the region D1' of the dielectric layer D1 and of forming the protuberance p15, is only one example of an embodiment. Other techniques can enable a floating gate FG to be produced that comprises a protuberance enabling the memory cell to be erased through the selection gate. The method described merely has the advantage of not requiring any additional manufacturing step to produce the protuberance, when a high voltage dielectric material is deposited on the substrate for the simultaneous production of high voltage transistors.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory cell, comprising:
a vertical selection gate in a trench in a substrate;
a floating gate on the substrate, the floating gate having a protuberance which extends below a first surface of the substrate, wherein the vertical selection gate includes a sidewall and the protuberance extends along the sidewall; and
a horizontal control gate on the floating gate.

2. The cell of claim 1, further comprising a dielectric layer between the protuberance and the sidewall of the vertical selection gate.

3. The cell of claim 2 wherein the dielectric layer is also between the substrate and the vertical selection gate in the trench.

4. The memory cell of claim 2, wherein the dielectric layer includes a thinner region that extends between a lower portion of the vertical selection gate and the substrate and a thicker region that extends between the protuberance and the vertical selection gate.

5. The memory cell of claim 4, wherein the protuberance extends in the thicker region of the dielectric layer and has a face opposite a portion of the vertical selection gate.

6. A device, comprising:
a substrate;
a trench in the substrate;
a transistor including:
a first gate in the trench in the substrate; and
a second gate on the substrate, the second gate having a protuberance that extends into the trench, the second gate being a floating gate, wherein the first gate includes a sidewall and the protuberance extends along the sidewall.

7. The device of claim 6 wherein the transistor includes a third gate on the second gate.

8. The device of claim 6, further comprising a first dielectric layer on the substrate in the trench, between the substrate and the first gate.

9. The device of claim 8 wherein the first dielectric layer is adjacent to sides of the protuberance.

10. The device of claim 9, further comprising a second dielectric layer and a third gate, the second dielectric layer between the third gate and the second gate.

11. The device of claim 6, further comprising a dielectric layer includes a thinner region that extends between a lower portion of the first gate and the substrate and a thicker region that extends between an upper portion of the first gate and the substrate, wherein the protuberance extends in the thicker region of the dielectric layer.

12. A device, comprising:
a substrate having a surface;
a first gate formed in the substrate;
a second gate formed on the first gate and on the substrate, the second gate including a first protuberance extending into the substrate past the surface of the substrate, the second gate being a floating gate;
a third gate formed on the first gate and on the substrate, the third gate including a second protuberance extending into the substrate past the surface of the substrate;
a first control gate on the second gate; and
a second control gate on the third gate.

13. The device of claim 12, further comprising a contact formed between the second gate and the third gate, the contact being formed on the first gate.

14. The device of claim 12, further comprising a first dielectric layer that separates the first gate from the substrate and that separates the first and second protuberances from the first gate.

15. The device of claim 14, further comprising a second dielectric layer between the second and third gates and the substrate.

16. The device of claim 15 wherein the second dielectric layer is between the first and second protuberances and the first dielectric layer.

17. The device of claim 14, wherein the first dielectric layer includes a thinner region that extends between a lower portion of the first gate and the substrate and a thicker region that extends between the protuberance and the first gate.

18. The device of claim 17, wherein the protuberance extends in the thicker region of the dielectric layer and has a face opposite a portion of the first gate.

* * * * *

UNITED STATES PATENT AND TRADEMARK OFFICE
CERTIFICATE OF CORRECTION

PATENT NO. : 9,941,369 B2  
APPLICATION NO. : 15/195784  
DATED : April 10, 2018  
INVENTOR(S) : Francesco La Rosa et al.

Page 1 of 1

It is certified that error appears in the above-identified patent and that said Letters Patent is hereby corrected as shown below:

In the Claims

Column 12, Line 51:
"17. The device of claim 14, wherein the first dielectric" should read --17. The device of claim 12, wherein the first dielectric--.

Signed and Sealed this
Twenty-first Day of May, 2019

Andrei Iancu
*Director of the United States Patent and Trademark Office*